(12) United States Patent
Jiang

(10) Patent No.: US 10,510,779 B2
(45) Date of Patent: Dec. 17, 2019

(54) ARRAY SUBSTRATE AND METHOD FOR FABRICATING THE SAME, AND DISPLAY DEVICE

(71) Applicant: BOE TECHNOLOGY GROUP CO., LTD., Beijing (CN)

(72) Inventor: Chunsheng Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/321,812

(22) PCT Filed: Mar. 3, 2016

(86) PCT No.: PCT/CN2016/075430
§ 371 (c)(1),
(2) Date: Dec. 23, 2016

(87) PCT Pub. No.: WO2016/161860
PCT Pub. Date: Oct. 13, 2016

(65) Prior Publication Data
US 2017/0133403 A1    May 11, 2017

(30) Foreign Application Priority Data
Apr. 9, 2015   (CN) .......................... 2015 1 0166992

(51) Int. Cl.
*H01L 27/12* (2006.01)
*H01L 29/45* (2006.01)
(Continued)

(52) U.S. Cl.
CPC .......... *H01L 27/124* (2013.01); *H01L 21/321* (2013.01); *H01L 27/1248* (2013.01);
(Continued)

(58) Field of Classification Search
CPC ............... H01L 27/124; H01L 27/1225; H01L 29/7869; H01L 29/66969; H01L 27/1288
See application file for complete search history.

(56) References Cited

U.S. PATENT DOCUMENTS

2013/0200382 A1   8/2013  Kim et al.
2015/0255268 A1*  9/2015  Vellianitis ......... H01L 29/66795
                                                        438/768

FOREIGN PATENT DOCUMENTS

CN    101174650 A    5/2008
CN    102033343 A    4/2011
(Continued)

OTHER PUBLICATIONS

China Office Action (1), Application No. 201510166992.X, dated Dec. 7, 2015, 15 pps.: with English Translation.
(Continued)

*Primary Examiner* — Tony Tran
(74) *Attorney, Agent, or Firm* — Armstrong Teasdale LLP

(57) ABSTRACT

The present disclose provides in some embodiments an array substrate and a method for fabricating the same, and a display device. The array substrate includes a source-drain metal layer formed on a base substrate and including copper, an alloy layer formed on the source-drain metal layer and including copper alloy, non-copper metal in the copper alloy being easier to be oxidized than copper in the copper alloy, a passivation layer formed on the alloy layer, and an oxide layer formed between the alloy layer and the passivation layer.

4 Claims, 3 Drawing Sheets

(51) Int. Cl.
*H01L 21/321* (2006.01)
*H01L 29/786* (2006.01)

(52) U.S. Cl.
CPC .......... *H01L 27/1259* (2013.01); *H01L 29/45* (2013.01); *H01L 29/78618* (2013.01)

(56) References Cited

FOREIGN PATENT DOCUMENTS

| | | | |
|---|---|---|---|
| CN | 103227208 A | 7/2013 |
| CN | 104465786 A | 3/2015 |
| CN | 104505391 A | 4/2015 |
| CN | 104795402 A | 7/2015 |

OTHER PUBLICATIONS

China Office Action (2), Application No. 201510166992.X, dated Mar. 15, 2016, 12 pps.: with English Translation.
PCT (CN) Written Opinion, Application No. PCT/CN2016/075430, dated Jun. 12, 2016, 6 pps.: with English Translation.
English Translation of PCT (CN) International Search Report, Application No. PCT/CN2016/075430, dated Jun. 12, 2016, 2 pps.

\* cited by examiner

ARRAY SUBSTRATE AND METHOD FOR FABRICATING THE SAME, AND DISPLAY DEVICE

CROSS REFERENCE TO RELATED APPLICATIONS

This application is a National Stage entry of PCT/CN2016/075430 filed Mar. 3, 2016, which claims priority to Chinese Patent Application No. 201510166992.X, filed on Apr. 9, 2015, the disclosures of which are incorporated herein by reference in their entirety as part of the present application.

BACKGROUND

The present disclosure relates to the field of displaying technology, in particular to an array substrate and a method for fabricating the same, and a display device.

As shown in FIG. 1, in the course of fabricating display device backplane, aluminum (Al) was first adopted as metal wiring material, for example, as a source electrode and a drain electrode of each of driving Thin-Film Transistors (TFTs). However, as resolution of the backplane increases significantly, wirings made of Al are no longer suitable for new requirements. Elimination of Al wirings in the art is due to the facts that they have a higher electrical resistivity, are prone to electromigration failure, and have Hillock problem during the fabricating process, and other known or unknown defects.

In comparison with Al, copper (Cu) has the following advantages. Firstly, Cu has lower electrical resistivity than Al, which is about 1.7 $\mu\Omega\cdot$cm lower than 2.7 $\mu\Omega\cdot$cm of Al electrical resistivity. As a result, lower electrical resistivity can mitigate Interference Resistance (IR) Drop and improve response speed. Secondly, Cu has lower power loss and consumes less energy thanks to its narrow pitch (i.e., wiring width). Thirdly, Cu has a high wiring density, which is good for achieving high definition. Fourthly, Cu has a higher electromigration resistance capability than Al, because of its higher melting point. As a result, Cu has a better electromigration resistance capability than other metals.

Even though Cu has the above good electricity performance, the following problems in terms of mechanics and electricity cannot afford to be overlooked when Cu is introduced as a source electrode, a drain electrode, and wirings. Firstly, Cu is limited by its strong diffusion capability, which may result in failure of TFT devices. Secondly, Cu has a poor bonding strength with SiNx or SiOx (which can be adopted as passivation layer materials). Accordingly, other metals are needed as a transition, which in turn increases the challenges for etching Cu. Thirdly, Cu is prone to being oxidized in an environment of low temperature (less than 200° C.) but hard to produce a compact oxide film that is used to prevent Cu from further oxidization while the oxidization of Cu will cause obvious Mura defect occurs in the display.

Accordingly, when Cu is chosen as wiring material, how to avoid its above deficiencies becomes one of noticeable and urgent technical problems.

BRIEF DESCRIPTION

According to some embodiments of the present disclosure, when copper is adopted as a source electrode and a drain electrode of a TFT, a higher bonding strength between the source-drain electrode and the passivation layer can be achieved, in the meantime the oxidization of the source-drain electrode can be prevented.

In a first aspect, embodiments of the present disclosure provide an array substrate, which includes a source-drain metal layer formed on a base substrate and including copper, an alloy layer formed on the source-drain metal layer, and including copper alloy, wherein non-copper metal in the copper alloy is easier to be oxidized than copper in the copper alloy, a passivation layer formed on the alloy layer, and an oxide layer formed between the alloy layer and the passivation layer.

In one possible embodiment, the oxide layer is formed by bonding between the non-copper metal in the alloy layer and atoms having oxidizability in the passivation layer.

In one possible embodiment, the array substrate further includes data lines formed on the base substrate wherein the date lines include copper.

In one possible embodiment, the array substrate further includes a gate electrode formed on the base substrate, a gate insulation layer formed on the gate electrode, an active layer formed on the gate insulation layer, and an etching stop layer (ESL) formed on the active layer.

In one possible embodiment, the array substrate further includes an anti-diffusion layer arranged between the ESL and the source-drain metal layer.

In one possible embodiment, the anti-diffusion layer is made of molybdenum niobium alloy.

In one possible embodiment, a ratio of the non-copper metal to copper atoms in the alloy is within a range of 5 atomic percentage (at %) to approximately 12 atomic percentage (at %).

In one possible embodiment, the copper alloy includes copper-magnesium alloy or copper-aluminum alloy.

In one possible embodiment, the oxide layer includes nitride.

In one possible embodiment, the nitride includes magnesium nitride.

In a second aspect, embodiments of the present disclosure provide a display device, which includes any one of the above array substrates.

In a third aspect, embodiments of the present disclosure provide a method for fabricating an array substrate, which includes forming a source-drain metal layer on a base substrate, wherein the source-drain metal layer includes copper, forming an alloy layer on the source-drain metal layer using copper alloy, wherein the alloy layer includes the copper alloy, and wherein non-copper metal is easier to be oxidized than copper in the copper alloy, forming a passivation layer on the alloy layer, and forming an oxide layer sandwiched between the alloy layer and the passivation layer.

In one possible embodiment, forming the oxide layer includes an annealing process, such that the oxide layer sandwiched between the alloy layer and the passivation layer is formed by binding between the non-copper metal in the alloy layer and atoms having oxidizability in the passivation layer.

In one possible embodiment, the annealing process is performed for approximately one hour in an environment with an ambient temperature of about 280° C.

In one possible embodiment, prior to forming the source-drain metal layer, the method further includes forming data lines each of which includes copper formed on the base substrate.

In one possible embodiment, prior to forming the source-drain metal layer, the method further includes forming a gate electrode on the base substrate, forming a gate insulation layer on the gate electrode, forming an active layer on the gate insulation layer, and forming an ESL on the active layer.

In one possible embodiment, prior to forming the source-drain metal layer, the method further includes forming an anti-diffusion layer on the ESL.

In one possible embodiment, the copper alloy includes copper-magnesium alloy or copper-aluminum alloy.

In one possible embodiment, the oxide layer includes nitride.

In one possible embodiment, the nitride includes magnesium nitride.

According to some embodiments of the present disclosure, though the source electrode and the drain electrode are formed both including copper, a higher bonding strength between the source-drain electrode and the passivation layer can be achieved, in the meantime, the oxidization of the source-drain electrode can be prevented and Cu atoms diffusion in the source-drain electrode can also be prevented.

BRIEF DESCRIPTION OF THE DRAWINGS

In order to illustrate the technical solutions of the present disclosure or the related art in a more apparent manner, the drawings desired for the embodiments of the present disclosure will be described briefly hereinafter. Obviously, the following drawings merely relate to some embodiments of the present disclosure and are not intended to limit the scope of the present disclosure, and based on these drawings, a person skilled in the art may obtain the other drawings without any creative effort.

DETAILED DESCRIPTION

In order to make the technical solutions and the advantages of the present disclosure more apparent, the present disclosure will be described hereinafter in a clear and complete manner in conjunction with the drawings and embodiments. It should be understood that the embodiments can be combined with one another and features in different embodiments can be combined with one another and based on these embodiments, a person skilled in the art may obtain the other embodiments, which also fall within the scope of the present disclosure.

Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

The description hereinafter discloses details to better describe the disclosure, however, other embodiments which are not described can also fall into the scope of present disclosure and the scope of present disclosure is not limited to embodiments described below.

Figure 1:
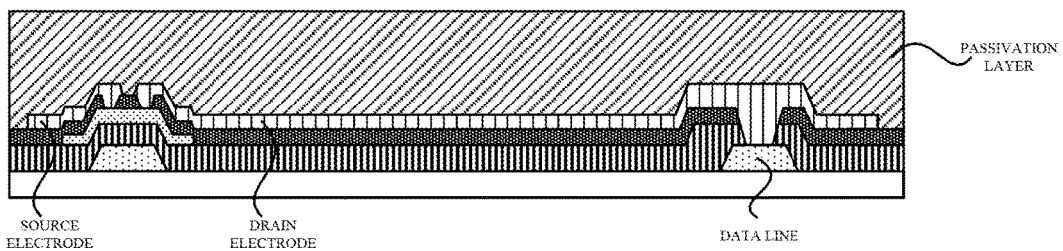
FIG. 1 is a schematic diagram illustrating a structure of an array substrate according to the related art.
Figure 2:
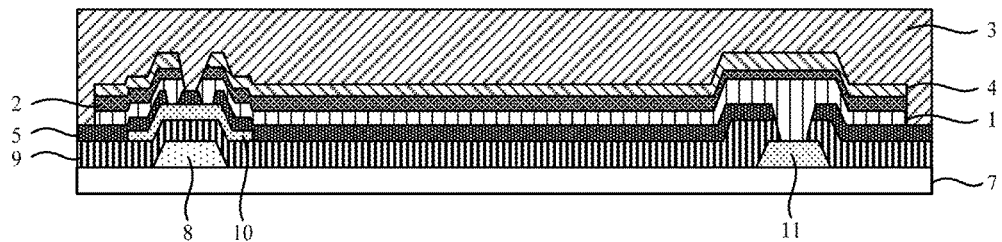
FIG. 2 is a schematic diagram illustrating a structure of an array substrate according to one embodiment of the present disclosure.

As shown in FIG. 2, an array substrate according to one embodiment of the present disclosure includes a source-drain metal layer 1 formed on a base substrate 7 by using copper, an alloy layer 2 formed on the source-drain metal layer 1 by using copper alloy, wherein non-copper metal in the copper alloy is easier to be oxidized than copper in the copper alloy, a passivation layer 3 formed on the alloy layer 2, and an oxide layer 4 formed between the alloy layer 2 and the passivation layer 3.

It is clear that non-copper metal in the alloy layer, for example magnesium (Mg) or aluminum (Al), is easier to be oxidized than copper in the alloy layer. Also it is to be noted that oxidization in the present embodiment refers to an oxidization in a broad sense, in which an object loses one or more electrons (namely, valence raised), such that metal is bonding with nitrogen (N) atoms or chlorine (Cl) atoms.

After forming the passivation layer 3, an annealing process is then performed on the base substrate 7, such that a compact oxide layer 4 sandwiched between the alloy layer 2 and the passivation layer 3 is formed by bonding between the non-copper metal adjacent to the passivation layer 3 in the copper alloy and atoms having oxidizability in the passivation layer 3.

Needless to say, the oxidization in the present embodiment refers to the one in a broad sense, namely compound formed by bonding between metal atoms and non-metal atoms. When the passivation layer 3 includes SiOx and the non-copper metal in the copper alloy is magnesium (Mg), the resultant oxide layer 4 includes magnesium oxide. On the other hand, when the passivation layer 3 includes SiNx and the non-copper metal in the copper alloy is magnesium (Mg), the resultant oxide layer 4 is magnesium nitride.

The oxide layer 4 is able to prevent Cu atoms in the source electrode and drain electrode from oxidization, which results in better stability for driving thin film transistors (TFT) on the array substrate during actual operation. In addition, due to the fact that the oxide layer 4 is formed by bonding between atoms in the alloy layer 2 and atoms in the passivation layer 3, the bonding strength between the alloy layer 2 and the passivation layer 3 can be enhanced, without the need for transition of other metal material nor increasing the difficulty for etching copper metal. Further, the resultant oxide layer 4 enables thin-film electricity resistance of driving TFTs to increase as well.

Furthermore, by comparing with aluminum metal in the related art, copper metal has lower electrical resistivity. As a result, having copper metal as a source electrode and a drain electrode enables to reduce Interference Resistance (IR) Drop, to improve response speed, and to have a better electromigration resistance capability due to its higher melting point than aluminum metal.

In one possible embodiment, the oxide layer 4 is formed by bonding between non-copper metal in the alloy layer 2 and atoms having oxidizability in the passivation layer 3.

In another possible embodiment, the array substrate further includes an anti-diffusion layer (not shown) arranged between the ESL 5 and the source-drain metal layer 1.

In another possible embodiment, the anti-diffusion layer is made of molybdenum niobium alloy.

It is noted that the anti-diffusion layer can effectively prevent copper atoms from diffusing into other layers of driving TFTs, such that stability of the driving TFTs can be guaranteed.

In another possible embodiment, the array substrate further includes data lines 11 each of which is formed on the base substrate 7 by using copper.

It is also noted that narrower pitch (i.e., wiring width) is achievable using copper metal. Accordingly, lower power consumption and less loss can also be achievable. And copper allows a higher wiring density, which is good for achieving high definition.

In another possible embodiment, the array substrate further includes a gate electrode 8 formed on the base substrate 7, a gate insulation layer 9 formed on the gate electrode 8, an active layer 10 formed on the gate insulation layer 9, and an ESL 5 formed on the active layer 10.

In another possible embodiment, a ratio of the non-copper metal to atoms in the alloy is within a range of 5 atomic percent (at %) to approximately 12 atomic percent (at %).

By having the above ratio limited within a range of 5 at % to approximately 12 at %, it is able to produce a compact oxide layer 4 and to prevent the source electrode and the drain electrode from further oxidization.

In another possible embodiment, the copper alloy includes copper-magnesium alloy or copper-aluminum alloy.

The present disclosure in some embodiments further provides a display device, which includes any one of the above array substrate.

It should be noted that the display device may be any product or component with a display function, such as an electronic paper (E-paper), a mobile phone, a tablet, a TV, a laptop, a digital photo frame, a navigator and so forth.

Figure 3:
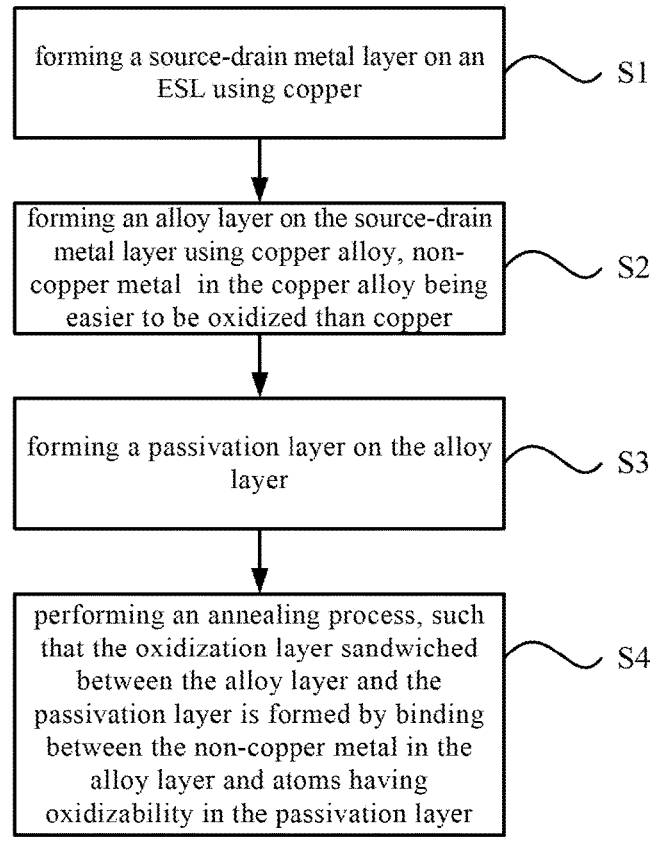
FIG. 3 is a flow chart illustrating a method for fabricating the array substrate according to one embodiment of the present disclosure.

In addition, as shown in FIG. 3, a method for fabricating an array substrate according to one embodiment of the present disclosure includes steps S1 through S4, for example.

Figure 4:
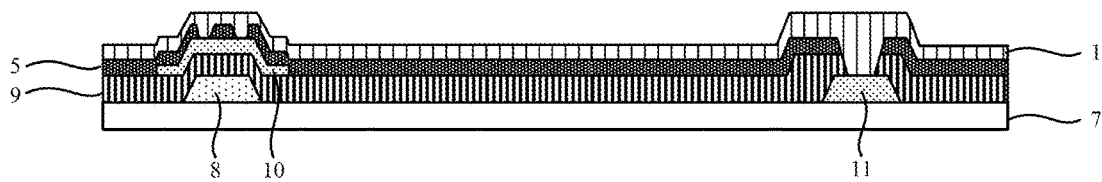
FIGS. 4-8 are schematic diagrams illustrating the method for fabricating the array substrate according to one embodiment of the present disclosure.

In step S1, a source-drain metal layer 1 is formed on a base substrate 7 using copper, as shown in FIG. 4.

Figure 5:
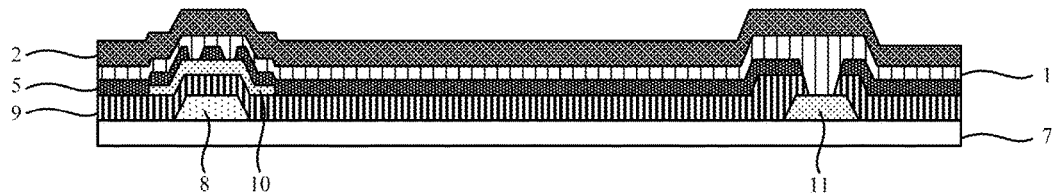
Figure 6:
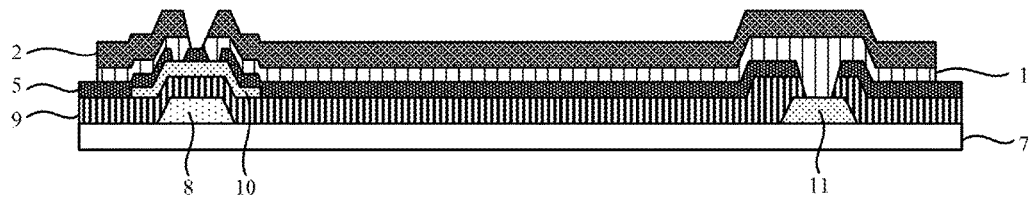

In step S2, an alloy layer 2 is formed on the source-drain metal layer 1 using copper alloy, wherein the non-copper metal in the copper alloy is easier to be oxidized than copper in the copper alloy, as shown in FIG. 5. Further, after the alloy layer 2 is formed, an etching process is conducted on the alloy layer 2, such that source electrode pattern and drain electrode pattern are formed on the source-drain metal layer 1, as shown in FIG. 6.

Figure 7:
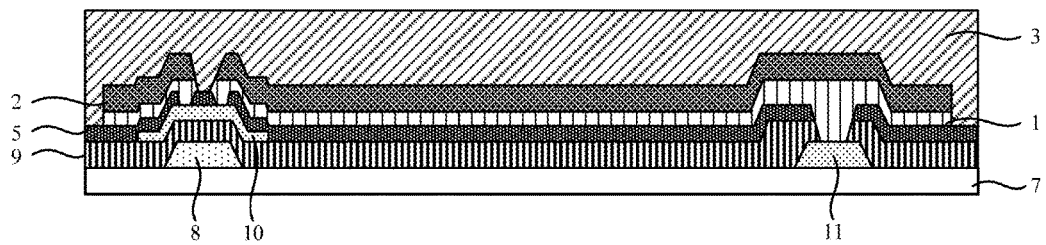

In step S3, a passivation layer 3 is formed on the alloy layer 2, as shown in FIG. 7.

Figure 8:
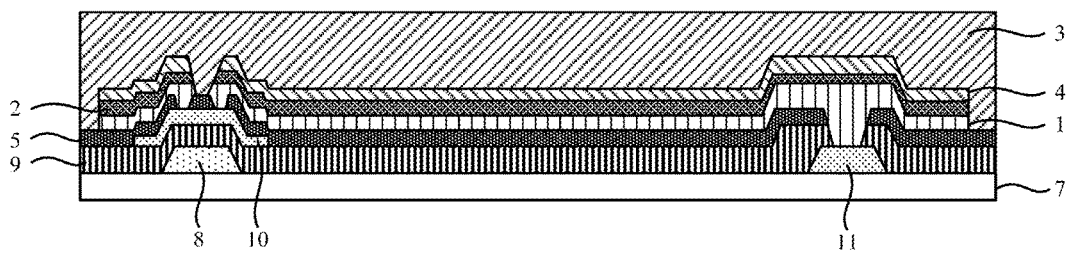

In step S4, an annealing process is conducted, such that the bonding non-copper metal in the alloy layer 2 bond with atoms having oxidizability in the passivation layer 3 to form an oxide layer 4 sandwiched between the alloy layer 2 and the passivation layer 3, as shown in FIG. 8.

In one possible embodiment, the annealing process is performed for approximately one hour in an environment where ambient temperature is about 280° C. The annealing process is conducted in the air environment without the need for a complicated operation environment, which is suitable for lowering fabricating cost. Further, by conducting the annealing process for approximately one hour in an environment where ambient temperature is about 280° C., unused copper atoms in the alloy layer 2 will migrate toward the passivation layer 3 slowly, so as to realize bonding with non-metal atoms in the passivation layer 3. As a result, it is possible to produce a compact oxide layer 4 and to prevent the source electrode and the drain electrode from further oxidization.

In one possible embodiment, prior to forming the source-drain metal layer 1, the method further includes forming an anti-diffusion layer (not shown) on the ESL 5.

In one possible embodiment, prior to forming the source-drain metal layer 1, the method further includes forming data lines 11 on the base substrate 7 by using copper.

In one possible embodiment, prior to forming the source-drain metal layer 1, the method further includes forming a gate electrode 8 on the base substrate 7, forming a gate insulation layer 9 on the gate electrode 8, forming an active layer 10 on the gate insulation layer 9, and forming the ESL 5 on the active layer 10.

Certain embodiments of the present disclosure have been described in detail in connection with figures. In consideration that having aluminum as a source electrode and a drain electrode of the driving TFTs can hardly meet ever-increasing definition requirement for the wirings, and new problems arise when copper metal is adopted. According to embodiments of the present disclosure, though the source electrode and the drain electrode are formed, both electrodes include copper, a higher bonding strength between the source-drain electrode and the passivation layer can be achieved, in the meantime, the oxidization of the source-drain electrode can be prevented and Cu atoms diffusion in the source-drain electrode can also be prevented.

Besides, it should be noted that the expression such as "using Cu" is not exclusive and other suitable materials can also be included.

It should be understood that the dimensions of the layers and regions may be exaggerated for clarity of illustration. When a first element is "on" or "atop" a second element, the first element may be directly on the second element without an intervening element sandwiched there between or at least one intervening element may be present between the first element and the second element. Similarly, when a first element is "under" or "bellow" a second element, the first element may be directly under the second element without an intervening element sandwiched there between or at least one intervening element may be present between the first element and the second element. When a layer or an element is "between" two layers or two elements, the layer or element may be the only layer or element between the two layers or two elements, or at least one intervening layer or element may be present between the two layers or the two elements. In this specification, similar components are marked with the same reference numerals. The above are merely example embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. An array substrate, comprising:
   a source-drain metal layer formed on a base substrate, the source-drain metal layer including copper;
   an alloy layer formed on the source-drain metal layer, the alloy layer including copper alloy, wherein non-copper metal in the copper alloy is more easily oxidized than copper in the copper alloy, wherein the copper alloy includes copper-aluminum alloy, and wherein a ratio of the non-copper metal to atoms in the alloy is within a range of 5 atomic percent (at %) to approximately 12 atomic percent (at %);

a passivation layer formed on the alloy layer;

an oxide layer formed between the alloy layer and the passivation layer, wherein the oxide layer comprises the non-copper metal and the same atoms as atoms having oxidizability in the passivation layer;

data lines that each include copper formed on the base substrate;

a gate electrode formed on the base substrate;

a gate insulation layer formed on the gate electrode;

an active layer formed on the gate insulation layer;

an etching stop layer (ESL) formed on the active layer; and an anti-diffusion layer arranged between the ESL and the source-drain metal layer, wherein the anti-diffusion layer includes molybdenum niobium alloy.

2. The array substrate according to claim 1, wherein the oxide layer includes nitride.

3. The array substrate according to claim 2, wherein the nitride includes magnesium nitride.

4. A display device, comprising the array substrate according to claim 1.

* * * * *